United States Patent [19]

Takahashi et al.

[11] 4,096,360

[45] Jun. 20, 1978

[54] MULTICHANNEL RECORD DISC REPRODUCING SYSTEM

[75] Inventors: Nobuaki Takahashi, Yamato; Fujio Suzuki, Yokohama; Katsuhiro Ohba, Toyohashi, all of Japan

[73] Assignee: Victor Company of Japan, Ltd., Yokohama, Japan

[21] Appl. No.: 725,569

[22] Filed: Sep. 22, 1976

[30] Foreign Application Priority Data

| | | |
|---|---|---|
| Sep. 27, 1975 | Japan | 50-116605 |
| Oct. 8, 1975 | Japan | 50-121567 |
| Oct. 8, 1975 | Japan | 50-121568 |
| Oct. 30, 1975 | Japan | 50-127733 |

[51] Int. Cl.[2] .......... G11B 3/74; H03D 3/00

[52] U.S. Cl. .......... 179/100.4 ST; 179/1 GQ; 179/100.1 TD; 329/122

[58] Field of Search .......... 179/100.4 ST, 100.1 TD, 179/1 GQ, 15 BT, 100.4 M; 325/419, 421, 423; 329/122, 123, 124; 331/23, 25

[56] References Cited

U.S. PATENT DOCUMENTS

| | | | |
|---|---|---|---|
| 3,746,993 | 7/1973 | Ahmed | 329/123 |
| 3,772,467 | 11/1973 | Ohwaki | 179/100.4 ST |
| 3,911,232 | 10/1975 | Itoh | 179/100.4 ST |
| 3,936,618 | 2/1976 | Takahashi | 179/100.4 ST |
| 3,983,500 | 9/1976 | Takahashi | 179/100.4 ST |

*Primary Examiner*—Bernard Konick
*Assistant Examiner*—Alan Faber

[57] ABSTRACT

A multichannel record disc reproducing system comprises at least two phase-locked loops. Each loop includes a phase comparator and a voltage-controlled oscillator for respectively demodulating an angle-modulated signal which is separated from a signal picked up from a multichannel record disc. The picked up signal includes a direct-wave signal and an angle-modulated signal which were multiplexed and recorded. An addition circuit adds the demodulated output signals of the phase-locked loops. The respective phase-locked loops have different lock ranges in order to exclude noise and other distortion.

7 Claims, 9 Drawing Figures

MULTICHANNEL RECORD DISC REPRODUCING SYSTEM

BACKGROUND OF THE INVENTION

This invention relates generally to multichannel record disc reproducing systems. More particularly, it relates to a system for demodulating and reproducing without distortion and with a high signal-to-noise ratio. The reproduced signal comprises an angle-modulated signal picked up from a multichannel record disc through the use of a plurality of phase-locked loops having, respectively, different lock ranges.

Systems for demodulating angle-modulated signals by means of phase-locked loops (hereinafter referred to as PLL) have been known in the prior art. A PLL of this type generally comprises a phase comparator which is supplied with an angle-modulated signal as one input. A loop filter is used for attenuating the high-frequency component of an output error signal from the phase comparator. A direct-current amplifier amplifies the output signals from the loop filter. A voltage-controlled oscillator generates a frequency which is controlled by the output of the direct-current amplifier. The resulting output of the oscillator is supplied, as a phase comparison signal, to the phase comparator. A demodulated output signal is derived from the direct-current amplifier. The direct-current amplifier may be omitted. The frequency characteristic of the demodulated signal is determined by the width of the lock range or capture range of the PLL.

There may be a carrier drop in the signal reproduced from a multichannel record disc, on which a direct-wave signal and an angle-modulated signal have been multiplexed and recorded. That is, an absence of the carrier component may occur in the reproduced angle-modulated signal or there may be an over-modulation due to a disturbance caused by a frequency close to the carrier frequency. This close frequency may be a higher harmonic of the direct wave. As a result, an abnormal noise is generated.

Accordingly, in order to reduce or eliminate this noise, it has been a conventional practice to constrict the lock range of the PLL when an abnormal noise occurs. By this expedient, an abnormal locking of the PLL is prevented. Furthermore, the high-frequency component (for example, in the vicinity of 8 KHz) of the demodulated signal is attenuated, whereby the apparent noise level is lowered. As is known, the lock range or capture range of a PLL is determined by the loop gain of the PLL. This loop gain is determined principally by quantities such such factors as the gain of the direct-current amplifier, the passing quantity of the loop filter, and the conversion gain of the phase comparator and the voltage-controlled oscillator. The prior art has varied the lock range by increasing and decreasing this loop gain of the PLL, so that the characteristic of the loop filter is varied.

Usually, this loop filter includes a lag-lead filter comprising a fixed resistor connected between the input and output terminals and a series connection of a capacitor and a variable resistor connected between ground and the junction between the fixed resistor and the output terminal. This combination constitutes a kind of low-pass filter. By varying the resistance of the variable resistor in this loop filter, the characteristic of this loop filter is changed, and the loop gain of the PLL varies. Hence, the lock range of the loop is appropriately varied and set. Here, increasing the resistance value of the variable resistor of the loop filter causes the lock range width to increase, while decreasing the same resistance value causes the lock range width to decrease.

An angle-modulated signal is obtained by modulating a carrier with a modulation signal in which much energy is distributed particularly in a high-frequency range (in the vicinity of 8 KHz). For example, this is the frequency range which may include the sound of cymbals. When such a signal is reproduced and is introduced into the PLL, its lock range is made narrower than the deflection frequency width of the angle-modulated signal. This narrowing is accomplished by varying the above mentioned variable resistor. As a result, even when there are higher harmonics of the direct-wave signal, admixed in the angle-modulated wave band, the PLL does not erroneously lock with these higher harmonics. Furthermore, as a result of the smaller lock range of the PLL, there is an attenuation of the high-frequency band of the demodulation by the PLL. Therefore, even if the PLL should unlock, the noise in the high-frequency band will be attenuated, and a great noise will not be sensed.

An angle-modulated signal may be obtained by modulating a carrier with a modulation signal, in which much energy is distributed particularly in a low-frequency range (in the vicinity of 2 KHz). For example, a signal such as this may include the sound of a trumpet. If the deviation frequency of this angle-modulated signal exceeds the lock range, this angle-modulated signal is relatively overmodulated with respect to the lock range of the PLL. In this case, an abnormal noise is generated in the output signal of the PLL despite the angle-modulated wave. This abnormal noise is very unpleasant to the ear.

Accordingly, the lock range of the PLL is made uniformly narrow in a conventional demodulation system in which a PLL is used. Therefore, the abnormal noise can be neglected from the standpoint of the sense hearing an angle-modulated signal produced by modulation a high frequency. However, if an angle-modulated signal is produced by modulation of a medium low frequency, the PLL unlocks, despite the normal angle-modulated signal. Beat sounds are generated by the input signal of the voltage-controlled oscillator and the input of the PLL. These beat sounds are very unpleasant to the ear.

Conversely, if the lock range of the PLL is broadened, the PLL responds rapidly. Although unlocking will not occur, the PLL responds to even a slight abnormality. Furthermore, the demodulation characteristic of the PLL extends up to the high-frequency range, at which it does not attenuate very much. For this reason, an unpleasant abnormal noise is heard.

Thus, there are mutually different advantages and disadvantages in the case of a narrow lock range and a wide lock range of the PLL. Consequently, it has not been possible to demodulate completely, without distortion or generation of noise, in a system wherein a single PLL is used for an input angle-modulated signal, and its lock range is controlled, as in the prior art.

SUMMARY OF THE INVENTION

Accordingly, a general object of the present invention is to provide a novel and useful multichannel record disc reproducing system.

Another and more specific object of the invention is to provide a multichannel record disc reproducing system having a demodulation system in which a plurality of PLLs, having respectively different widths of lock range, are used. In this system, it is possible to demodulate an angle-modulated signal with little distortion or noise.

A further object of the invention is to provide a multichannel record disc reproducing system in which a plurality of PLLs respectively having mutually different lock range widths are used. By detecting abnormality of an angle-modulated signal, the demodulated outputs of the PLLs are selectively added, to obtain a demodulated signal.

Other objects and further features of the invention will be apparent from the following detailed description with respect to preferred embodiments of the invention when read in conjunction with the accompanying drawings.

DETAILED DESCRIPTION

Figure 1:
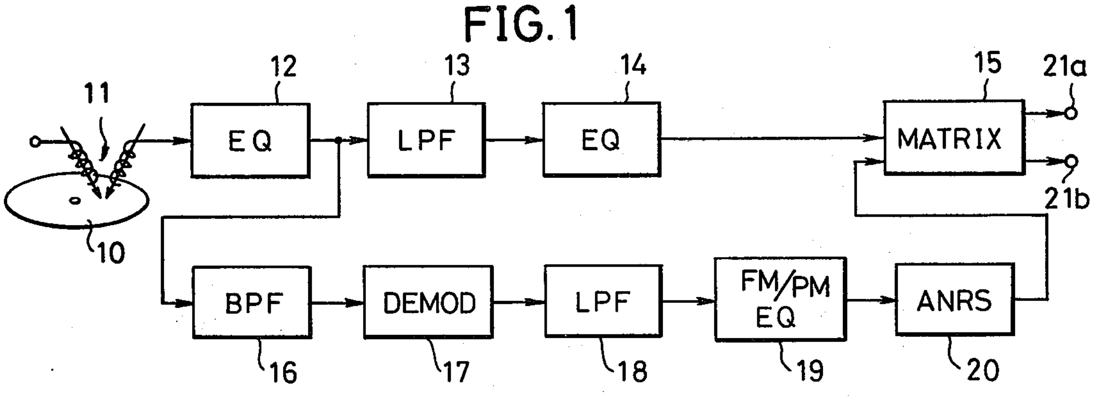
FIG. 1 is a block diagram showing one example of a multichannel record disc reproducing system, of a general type, to which the present invention can be applied.

A multiplexed signal comprising a direct wave sum signal and an angle-modulated difference signal for each pair of two channels, is recorded (FIG. 1) on each side wall of the sound groove of a four-channel record disc 10. A total of four channels are thus recorded. A pickup cartridge 11 picks up one pair of multiplexed signals, comprising the direct wave sum signal and the angle-modulated wave difference signal, from the left wall of the grooves of the disc 10. The picked up signal is fed to an equalizer 12, having an RIAA (Recording Industry Association of America) turnover characteristic.

The resulting signal is fed from equalizer 12 to a low-pass filter 13 for eliminating the angle-modulated wave component and for deriving only the direct wave sum signal component. The direct wave sum signal is fed to a matrix circuit 15, via an equalizer 14 having the RIAA roll-off characteristic.

The output of the equalizer 12 is partly fed to a band-pass filter 16 (or high-pass filter), having a passband in the approximate range of 20 KHz to 45 KHz. An angle-modulated wave difference signal is derived from this filter. For demodulation, the angle-modulated wave difference signal is fed to a demodulation circuit 17.

The demodulated output from the demodulation circuit 17 is supplied to a low-pass filter 18, where the unwanted components contained in the demodulated output are eliminated thereat. The output is fed from the low-pass filter 18 to the matrix circuit 15 via (in succession) an FM/PM equalizer 19 and an automatic noise reduction system (ANRS) circuit 20 comprising an expandor. The a characteristic of the expandor compensates for the characteristic of a compressor in the recording system.

The matrix circuit 15 combines the direct wave sum signal from the equalizer 14 and the demodulated difference signal from the ANRS circuit 20. From output terminals 21*a* and 21*b* are derived, for instance, the left front (the first channel) and the left rear (the second channel) signals, respectively.

FIG. 1 shows only the system for the first and second channel signals (the signals recorded on the left wall of the grooves of the disc 10). Exactly the same system is duplicated for the right front (the third) and the right rear (the fourth) channel. A detailed illustration and description of this right system are omitted herein.

Here, the demodulation circuit 17 constitutes an essential part of the system of the present invention. The demodulation circuit 17 will now be described with respect to several embodiments.

Figure 2:
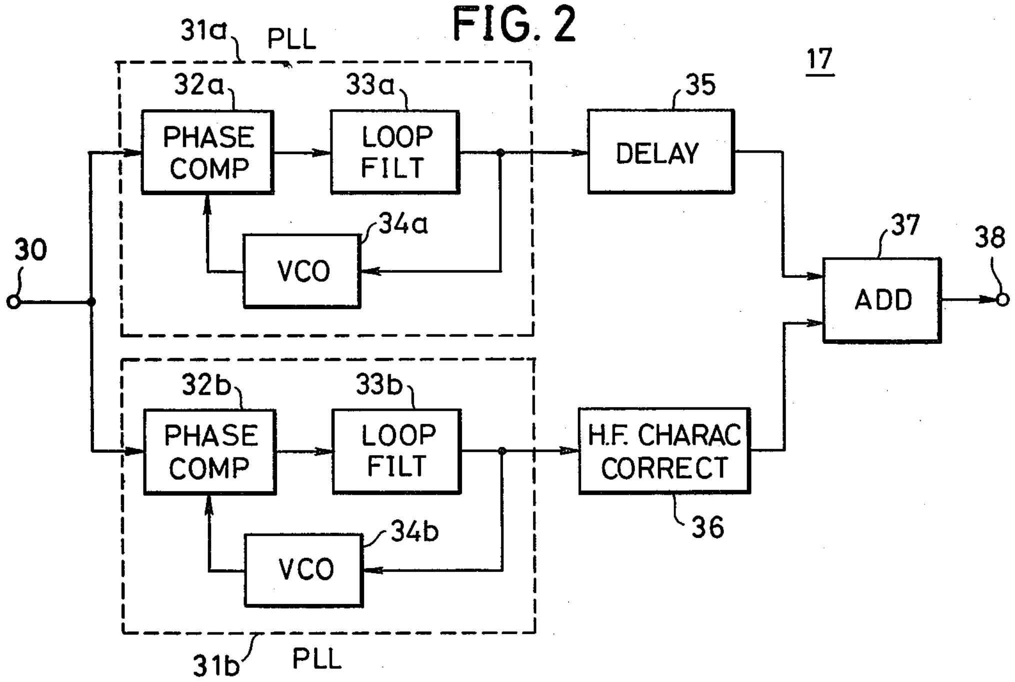
FIG. 2 is a block diagram showing one embodiment of an essential part of the system illustrated in FIG. 1.

FIG. 2 illustrates one embodiment of a demodulation circuit 17. An angle-modulated signal is introduced through an input terminal 30 to two PLLs 31*a* and 31*b*. The PLL 31*a* is of an ordinary design, comprising a phase comparator 32*a*, a loop filter 33*a*, and a voltage-controlled oscillator (VCO) 34*a*. The PLL 31*b* is similar, comprising similar components respectively designated by like reference numerals but with the suffix *b*.

The loop gain of the PLL 31*a* produces a lock range which is equal to or wider than the maximum deviation frequency range of the input angle-modulated signal. Accordingly, since its lock range is wide, the PLL 31*a* is capable of demodulating an angle-modulated signal, with little distortion, when it is recorded responsive to a modulation signal having great energy distributed in the medium and low frequencies as, for example, in a trumpet sound. It should be mentioned that, if the higher harmonics of the direct-wave signal band becomes admixed as a disturbance wave in the angle-modulated signal band, the PLL 31*a* also becomes locked to this disturbance wave. For this reason, the distortion due to this disturbance wave cannot be effectively prevented.

The demodulated output of the PLL 31*a* is delayed by a specific time in a delay circuit 35. Then it is fed to an addition circuit 37. The delay circuit 35 compensates for the time difference between the demodulated output signals of the PLLs 31*a* and 31*b* due to the difference between the lock ranges of these PLLs 31*a* and 31*b*.

The lock range of PLL 31*b* is narrower than the lock range of the PLL 31*a*. This narrow lock range causes the PLL 31*b* to demodulate by attenuating the high-frequency range, with respect to an angle-modulated signal which is produced responsive to a high energy modulation signal, particularly in the high frequencies as, for example, in the sound of cymbals. As a result, the noise level in the demodulated signal is apparently lowered. Furthermore, there is a reduction in the distortion due to interference with the angle-modulated signal particularly in response to the higher harmonics of the direct wave signal.

In this connection, the angle-modulated signal, which is produced responsive to a modulation signal in which much energy is distributed in the medium and low frequencies, has a frequency deviation which is greater than the lock range of the PLL 31b. Consequently, this angle-modulated signal is overmodulated relative to the lock range of the PLL 31b. If the angle-modulated signal of this character is demodulated, distortion will be generated in the PLL 31b.

The demodulated output of the PLL 31b passes through a high-frequency characteristic correction circuit 36 and there is supplied to the addition circuit 37. The high-frequency characteristic correction circuit 36 corrects the demodulated signal of the PLL 31b since its lock range is narrow and the high-frequency range of its demodulated signal is attenuated.

The addition circuit 37 adds the demodulated output of the PLL 31a, which has passed through the delay circuit 35, and the demodulated output of the PLL 31b which has passed through the high-frequency characteristic correction circuit 36. The resulting demodulated signal is led out through an output terminal 38.

If the higher harmonic component of the direct-wave signal band becomes admixed in the angle-modulated wave band, distortion does not occur in the demodulated output of the PLL 31b. Distortion (noise) is produced in the demodulated output of the PLL 31b. If the demodulation signal of the PLLs 31a and 31b is denoted by Vs, and the noise component within the demodulated output of the PLL 31a is denoted by $\sqrt{\overline{Vn_1^2}}$, the demodulated output of the PLL 31a is $(Vs + \sqrt{\overline{Vn_1^2}})$, and the demodulated output of the PLL 31b is $Vs$. Accordingly, the demodulated output appearing at terminal 38 is $(2Vs + \sqrt{\overline{Vn_1^2}})$. Therefore, when the two PLLs 31a and 31b are used, the signal-to-noise ratio is improved by approximately 6 dB as compared to the use of a single PLL 31a.

If the deviation frequency of an angle-modulated signal produced responsive to a modulation signal in which much energy is distributed in the medium low frequencies becomes greater than the lock range of the PLL 31b, distortion does not occur in the demodulated output of the PLL 31a. However, distortion (noise) is produced in the demodulated output of the PLL 31b. When this noise component is denoted by $\sqrt{\overline{Vn_2^2}}$, the resulting demodulated output appearing at output terminal 38 becomes $(2Vs + \sqrt{\overline{Vn_2^2}})$. Therefore, the signal-to-noise ratio is improved by approximately 6 dB as compared to the use of only one PLL 31b.

Furthermore, if the two above mentioned noises are generated simultaneously, the resulting demodulated output led out of the output terminal 38 becomes $(2Vs + \sqrt{\overline{Vn1^2}} + \sqrt{\overline{Vn_2^2}})$. Since these two noise components are generated responsive to different causes, their generation sources may be considered to be independent of each other. However, when their magnitudes are substantially the same, that is, when $\sqrt{\overline{Vn_1^2}} + \sqrt{\overline{Vn_2^2}} + \sqrt{\overline{Vo^2}}$, the above mentioned demodulated output becomes $$2Vs + \sqrt{\overline{Vn_1^2}} + \sqrt{\overline{Vn_2^2}} = 2Vs + \sqrt{2}\sqrt{\overline{Vo^2}}.$$

Therefore, the signal-to-noise ratio is improved by approximately 3 dB as compared to the use of either PLL 31a or 31b, alone.

If the delay time difference and the high-frequency characteristic difference of the PLLs 31a and 31b in the above described embodiment of the invention are negligibly small, the delay circuit 35 and the high-frequency characteristic correction circuit 36 may be omitted. Furthermore, three or more PLLs may be used.

Figure 3:
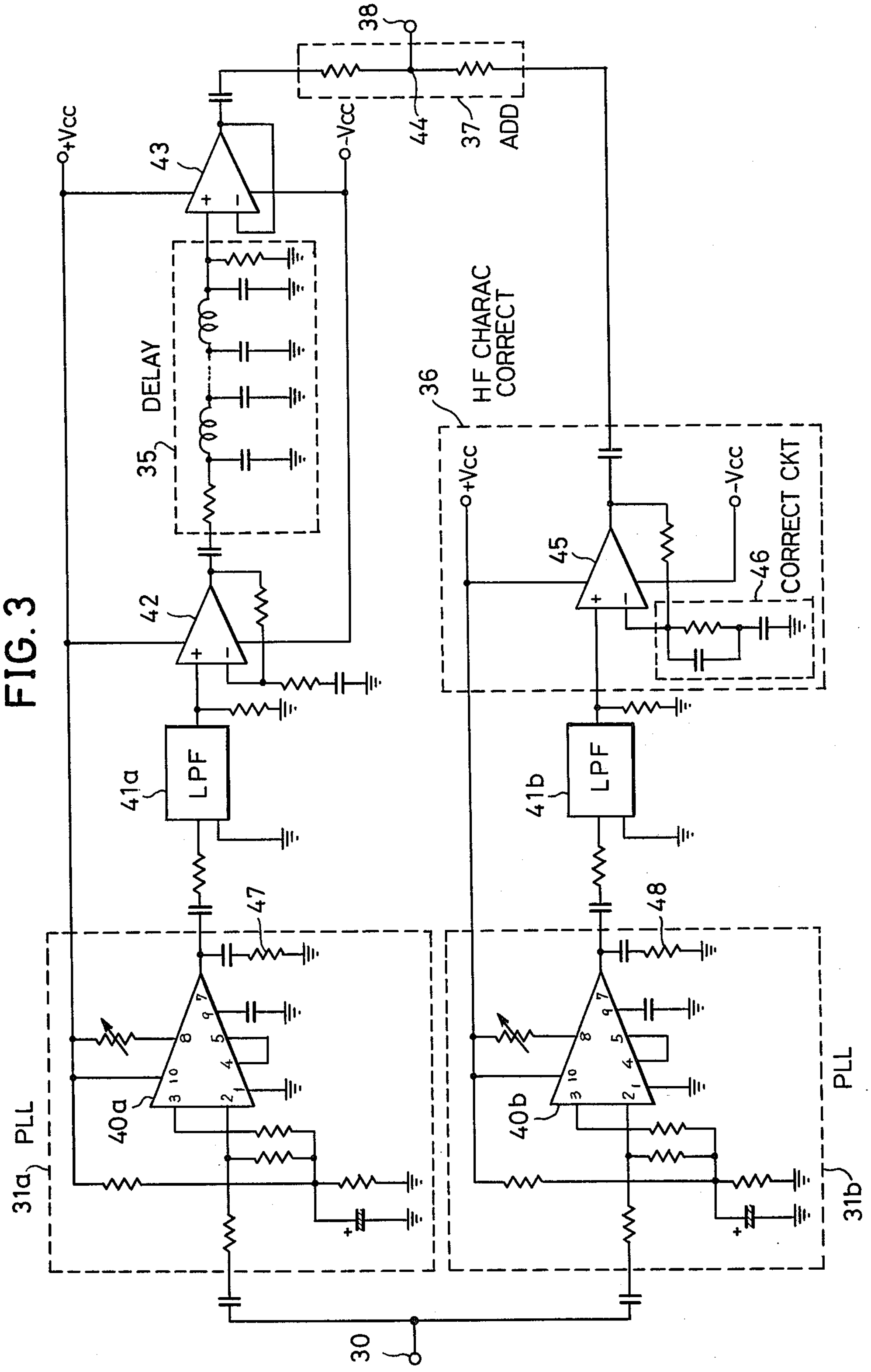
FIG. 3 is a circuit diagram showing one embodiment of a specific circuit for use in the block system shown in FIG. 2.

FIG. 3 shows one embodiment of a specific circuit for use in the system of FIG. 2. Those parts which are the same as corresponding parts in FIG. 2 are designated by like reference numerals.

An angle-modulated signal is introduced through the input terminal 30 and supplied to the PLLs 31a and 31b. The PLL 31a comprises an integrated circuit 40a containing built-in components such as the above mentioned phase comparator 31a, loop filter 33a, and voltage-controlled oscillator 34a. An output signal is demodulated in the PLL 31a and passed through a low-pass filter 41a, where its carrier component is removed. The resulting signal is passed through an amplifier 42 and the delay circuit 35, which comprises a plurality of inductors and capacitors. The demodulated signal which has passed through the delay circuit 35 is passed through an amplifier 43 and then fed to the addition circuit 37.

The angle-modulated signal is supplied through the input terminal 30 and demodulated in the PLL 31b, having an integrated circuit 40b. The resulting demodulated output is passed through a low-pass filter 41b, where its carrier component is removed. The resulting demodulated output is supplied to the high-frequency characteristic correction circuit 36. This correction circuit 36 comprises an operational amplifier 45 and a correction network 46, comprising a resistor and capacitors and connected in the negative feedback loop of the operational amplifier 45. The output signal of the correction circuit 36 is supplied to the addition circuit 37 and, at a junction 44, is added to the demodulated signal from amplifier 43. The resulting signal is led out through the output terminal 38.

Figure 4:
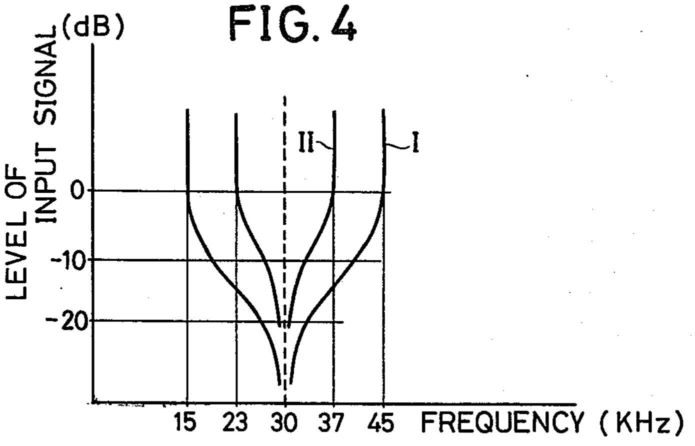
FIG. 4 is a graph indicating the PLLs lock range characteristics in the circuit shown in FIGS. 2 and 3.

The lock range widths of the PLLs 31a and 31b are determined by the resistance values of resistors 47 and 48. In the instant embodiment of the invention, the resistance value of the resistor 47 is 15 KΩ, while the resistor 48 is 3.3 KΩ. As a result, the lock ranges of the PLLs 31a and 31b are as indicated in FIG. 4. The curve I indicates the lock range of the PLL 31a, and the curve II indicates the lock range of the PLL 31b.

Furthermore, U.S. Pat. NO. 3,936,618, describes an input angle-modulated signal transmission system. A PLL and synchronous detector are provided. An unlocking of the PLL is detected by the synchronous detector to produce a detection signal for varying the lock range of the PLL. In this previous system, there is a problem since the output signal of the synchronous detector is also varied by the variation of the lock range of the PLL. Thus, an unlocking of the PLL cannot be detected with accuracy. Furthermore, there are various causes for abnormal noises. Hence, a single synchronous detector cannot distinguish and detect all abnormal noises, due to different causes.

Figure 5:
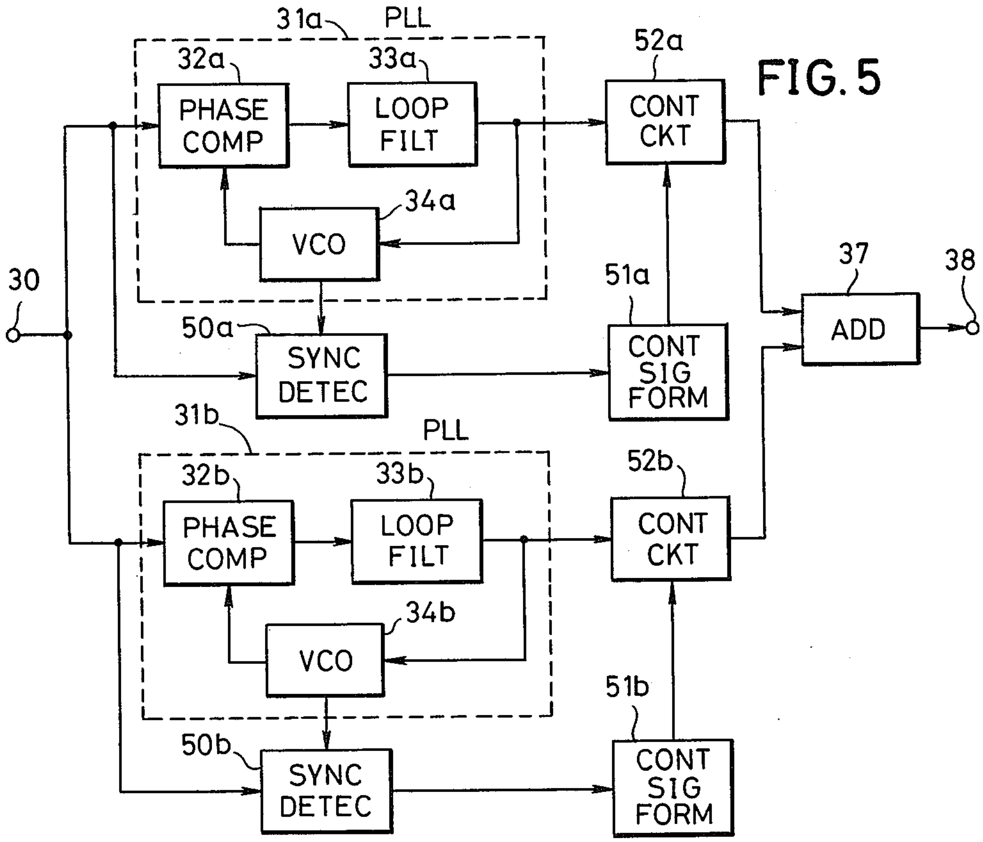
FIG. 5 is a block diagram of another embodiment of an essential part of the system of the invention.

FIG. 5 shows a second embodiment of the invention in which the concept of the above described embodiment is incorporated. In FIG. 5, those parts which are the same as corresponding parts in FIG. 2 are designated by like reference numerals and will not be described in detail again.

An angle-modulated signal is introduced through the input terminal 30 and supplied to the PLL 31a and to a synchronous detector 50a. From the voltage-controlled oscillator 34a, there is an output which is 90° out of phase relative to the oscillation output supplied to the phase comparator 32*a,* which is fed to the synchronous detector 50*a.* As a consequence, the input angle-modulated signal is subjected to the synchronous detector 50*a,* with the signal from the voltage-controlled oscillator 34*a.* The resulting synchronous detected output difference signal is formed into a control signal in a control signal forming circuit 51*a.*

When the PLL 31*a* locks to the input signal during normal demodulation, the input signal into the PLL 31*a* and the signal supplied from the voltage-controlled oscillator 34*a* to the phase comparator 32*a* have a phase difference of 90°. The input signal supplied into the synchronous detector 50*a* and the input signal from the voltage-controlled oscillator 34*a* to the synchronous detector 50*a* have a mutual relationship wherein the phase difference therebetween is zero degrees (same phase) or 180° (opposite phase) output voltage of the synchronous detector 50*a* is substantially zero. The synchronous detector 50*a* produces an output voltage in accordance with the phase difference between the input signal and the signal from the voltage-controlled oscillator 34*a.*

Since the lock range of the PLL 31*a* fixed, the synchronous detector 50*a* can accurately and positively detect abnormalities.

Figure 6:
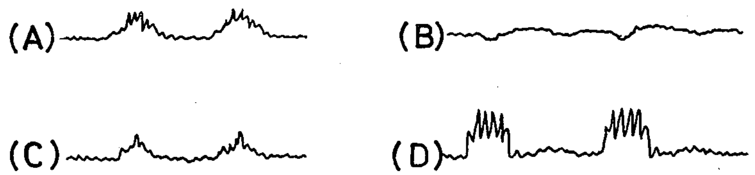
FIGS. 6(A) through 6(D) are output signal waveform diagrams respectively of the synchronous detectors in the FIG. 5.

The control signal from the control signal forming circuit 51*a* is supplied to a control circuit 52*a,* where it controls the demodulated output from the PLL 31*a.* An attenuation or muting circuit shown in FIG. 6 or 13 of U.S. Pat. No. 3,936,618, for example, can be used for the control circuit 52*a.*

The system containing the PLL 31*b* is similar to that described above. The corresponding parts are designated by like reference numerals, but with the subscript *b.* A detailed description of these parts will be omitted.

In the instant embodiment of the invention, as in the preceding embodiments, a delay circuit 35 may be provided in the demodulated output transmission system of the PLL 31*a.* A high-frequency characteristic correction circuit 36 may be provided in the demodulated output transmission system of the PLL 31*b.*

If an abnormal sound is generated in the demodulated signal as a result of admixing of the higher harmonics of the direct-wave signal into the angle-modulated signal band, the output signal waveform of the synchronous detector 50*a* of the wide lock range PLL 31*a* is as indicated in FIG. 6(A). The output signal waveform of a synchronous detector 50*b* of the narrow lock range PLL 31*b* is as indicated in FIG. 6(C).

Furthermore, if an angle-modulated signal, produced by a modulation signal in which much energy is distributed in the medium low frequencies, is introduced as input, and its frequency deviation is greater than the lock range of the PLL 31*b* (although it is less than the lock range of the PLL 31*a*), the output waveform of the synchronous detector 50*a* is as indicated in FIG. 6(B). The output waveform of the synchronous detector 50*b* is as indicated in FIG. 6(D) since the angle-modulated signal is in an overmodulated state relative to the lock range of the PLL 31*b.*

Accordingly, the control signal forming circuit 51*a* will form a control signal, not in response to the signal waveform of FIG. 6(B), but in response to the signal waveform of FIG. 6(A). Furthermore, the control signal forming circuit 51*b* will form a control signal, not in response to the signal waveform of FIG. 6(C), but in response to the signal waveform of FIG. 6(D).

Switching circuits may be used for the control circuits 52*a* and 52*b* and a demodulated output containing noise is cut off so that it will not be led out through the output terminal. Simple switching circuits are used for the control circuits 52*a* and 52*b.* A difference of 6 dB arises between the output levels when both demodulated outputs of the PLLs 31*a* and 31*b* are led out and when the demodulated output of one of the PLLs is led out. This is not desirable since, in this case a great variation occurs in the separation of the reproduced sound generated by the loudspeakers.

Accordingly, in the specific circuit described below, the output level is continually maintained constant, irrespective of switching operation.

Figure 7:
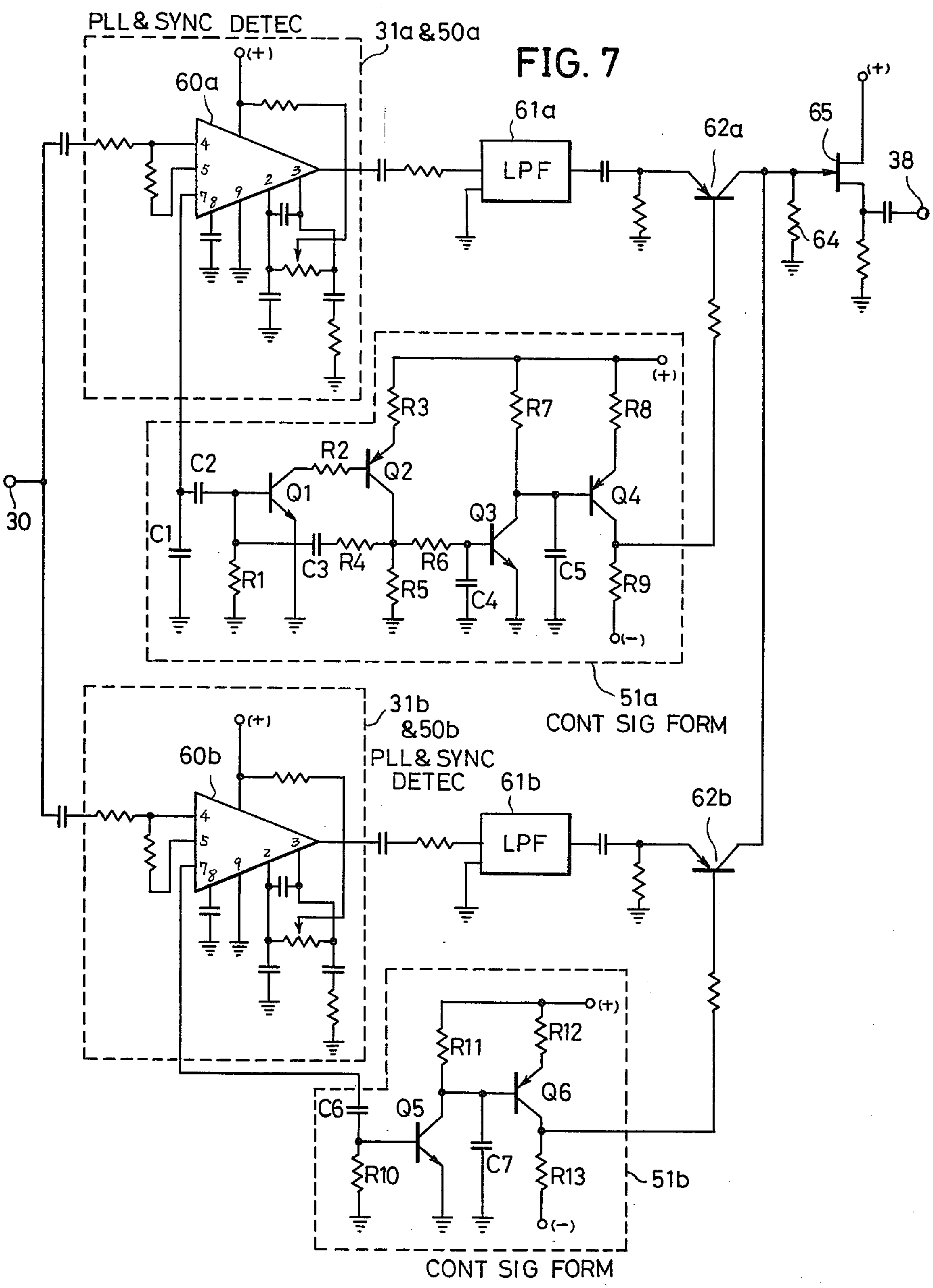
FIG. 7 is a circuit diagram of one embodiment of a circuit for use in FIG. 5.

FIG. 7 shows a specific circuit for use in the system illustrated in FIG. 5. In this circuit, switching circuits are used for the control circuits 52*a* and 52*b* in FIG. 5. In FIG. 7, those parts which are the same as corresponding parts in FIG. 5 are designated by like reference numerals.

An angle-modulated signal is introduced into this circuit through the input terminal 30. Then, it is supplied to a circuit including an integrated circuit 60*a* containing a built-in PLL 31*a* and the synchronous detector 50*a.* The input signal is also supplied to a circuit including an integrated circuit 60*b* containing a built-in PLL 31*b* and the synchronous detector 50*b.* Signals thus demodulated by the PLLs within the integrated circuits 60*a* and 60*b* are sent to respective lowpass filters 61*a* and 61*b.* There their unwanted carrier components are removed. Thereafter, they are supplied respectively to the emitters of switching transistors 62*a* and 62*b.*

Furthermore, detection signals from the synchronous detectors within the integrated circuits 60*a* and 60*b* are respectively supplied to the control signal forming circuits 51*a* and 51*b.* The control signal forming circuit 51*a* comprises transistors Q1 through Q4, resistors R1 through R9, and capacitors C1 through C5. The capacitor C2 and the resistor R1 constitute a differentiation circuit. The transistors Q1 and Q2, the resistors R1 through R5, and the capacitor C2 constitute a Schmitt trigger circuit. The resistor R6 and the capacitor C4 constitute an integration circuit for pulse density detection.

When a detection output is produced by the integrated circuit 60*a,* the transistors Q1, Q2, and Q3 successively switch "ON". The charge in the capacitor C5 is rapidly discharged through the transistor Q3. As a consequence, the transistor Q4 also switches "ON". The transistor 62*a,* whose base is connected to the collector of the transistor Q4, switches "OFF". When the synchronous detector stops producing its detection output, the transistors Q1, Q2, and Q3 successively switch "OFF". The capacitor C5 is charged through the resistor R7, with a relatively long time constant. When the capacitor C5 has been thus charged to a specific value, the transistor Q4 switches "OFF", and the transistor 62*a* switches "ON".

The control signal forming circuit 51*b* comprises transistors Q5 and Q6, capacitors C6 and C7, and resistors R10 through R13. The capacitor C6 and the resistor R10 constitute a differentiation circuit. When the synchronous detector of the integrated circuit 60*b* produces an output, the transistors Q5 and Q6 successively switch "ON", while the transistor 62*b* switches "OFF". When the output of the synchronous detector disappears, the transistors Q5 and Q6 switch "OFF", while the transistor 62*b* switches "ON".

The demodulated signals which have passed through the transistors 62*a* and 62*b* in an "ON" state are added at a junction point 63. The resulting signal is led out by way of a field-effect transistor (FET) 65 and through the output terminal 38. A resistor 64 of high impedance is connected between the point 63 and ground.

When the input voltages of the emitters of the transmitters are denoted respectively by $ei_1$ and $ei_2$, the signal source impedances thereof by $Rg_1$ and $Rg_2$, the resistances between the emitters and collectors of the transistors 62*a* and 62*b* by R*a* and R*b*, the resistance value of the resistor 64 by R*c*, and the voltage applied to the gate of the FET 65 by $e_o$, the voltage $e_o$ can be expressed as follows:

$$e_o = \frac{(Rg_2 + Rb)//Rc}{(Rg_2 + Rb)//Rc + (Rg_1 + Ra)} ei_1 + \frac{(Rg_1 + Ra)//Rc}{(Rg_1 + Ra)//Rc + (Rg_2 + Rb)} ei_2 \quad (1)$$

Then, if the signals passing through the transistors 62*a* and 62*b* are considered to be substantially equal, the following relationships may be used:

$$\left.\begin{matrix} ei = ei_1 = ei_2 \\ Rg = Rg_1 = Rg_2 \end{matrix}\right\} \quad (2)$$

From Eqs. (1) and (2), the following equation is obtained:

$$e_o = \left\{ \frac{(Rg + Rb)//Rc}{(Rg + Rb)//Rc + (Rg + Ra)} + \frac{(Rg + Ra)//Rc}{(Rg + Ra)//Rc + (Rg + Rb)} \right\} ei = \left[ \frac{(Rg + Rb)Rc}{(Rg + Rb)Rc + (Rg + Ra)\{(Rg + Rb) + Rc\}} + \frac{(Rg + Ra)Rc}{(Rg + Ra)Rc + (Rg + Rb)\{(Rg + Ra) + Rc\}} \right] \quad (3)$$

If the transistors 62*a* and 62*b* have the same characteristics and both are "ON", the following relationship is valid:

$$R = Ra = Rb \quad (4)$$

From Eqs. (3) and (4), the following equation can be obtained:

$$e_o = \frac{2(Rg + R)Rc}{(Rg + R)Rc + (Rg + R)(Rg + R) + Rc} ei = \frac{2(Rg + R)Rc}{2(Rg + R)Rc + (Rg + R)(Rg + R)} ei = \frac{1}{1 + \frac{Rg}{2Rc} + \frac{R}{2Rc}} ei \quad (5)$$

If, in this expression, $R \rightarrow 0$, and $Rc >> Rg$, the following relationship is obtained:

$$e_o \doteqdot ei \ldots (6)$$

If transistor 62*a* is "ON", and the transistor 62*b* is "OFF", the expression for $e_o$, from Eq. (3), becomes:

$$e_o = \frac{Rc\{(Rg + Rb) + (Rg + Ra)\}}{(Rg + Rb)(Rg + Rb) + Rc\{(Rg + Ra) + (Rg + Rb)\}} ei = \frac{Rc}{\frac{(Rg + Ra)(Rg + Rb)}{(Rg + Ra) + (Rg + Rb)} + Rc} ei = \frac{1}{1 + \frac{1}{\frac{1}{Rg + Ra} + \frac{1}{Rg + Rb}} \cdot \frac{1}{Rc}} ei \quad (7)$$

Since $Ra \rightarrow 0$, and $Rb \rightarrow \infty$, the following relationships are obtained:

$$\left.\begin{matrix} \frac{1}{Rg + Ra} \rightarrow \frac{1}{Rg} \\ \frac{1}{Rg + Rb} \rightarrow 0 \end{matrix}\right\} \quad (8)$$

From Eqs. (7) and (8), $$e_o = \frac{1}{1 + \frac{Rg}{Rc}} ei \quad (9)$$

Here, if $Rc >> Rg$, $e_o$ becomes:

$$e_o \doteqdot ei \ldots (10)$$

The above analysis and results are also the same when the transistor 62*a* is "OFF", while the transistor 62*b* is "ON".

Accordingly, if the impedance R*c* of the resistor 64 is switably greater than the impedance Rg, that is, if the preceding stages of the transistors 62*a* and 62*b* have low output impedances, and the succeeding stages thereof have high input impedances, the output level of both transistors 62*a* and 62*b* are "ON". The output levels are equal when either one of the transistors 62*a* and 62*b* is "OFF". Therefore, the output can be derived continually with a constant level irrespective of the "ON" and "OFF" states of the transistors 62*a* and 62*b*.

One example of constants of the circuit elements or components of the circuit organization described above is as follows:

| | | | | | |
|---|---|---|---|---|---|
| Resistors -- | | | | | |
| R1 | 10 KΩ, | R2 | 12 KΩ, | R3 | 100 Ω, |
| R4 | 15 KΩ, | R5 | 33 KΩ, | R6 | 33 KΩ, |
| R7 | 100 KΩ, | R8 | 680 Ω, | R9 | 220 KΩ, |
| 64 | 470 KΩ | | | | |
| Capacitors -- | | | | | |
| C1 | 1,800 PF, | C2 | 2,200 PF, | C3 | 0.033 μF, |
| C4 | 0.1 μF, | C5 | 10 μF, | C6 | 560 PF, |
| C7 | 10 μF | | | | |

Figure 8:
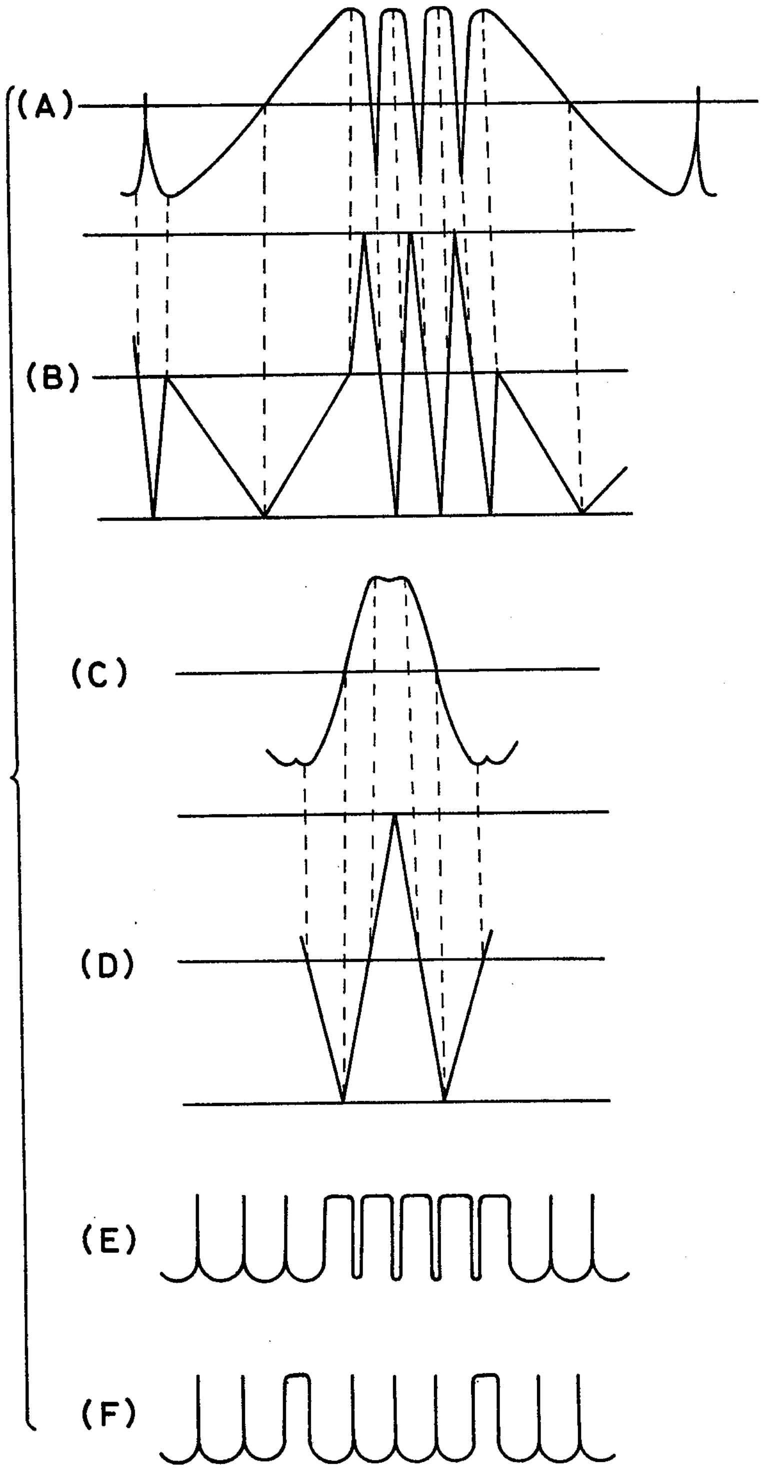
FIGS. 8(A) through 8(F) are graphs showing waveforms of the demodulated signal of the PLLs and of the output signals of the synchronous detectors.

Next to be considered is a system wherein there is a PLL 31*b* with a narrow lock range. When an angle-modulated input signal has a frequency deviation which is wider than the lock range of the PLL 31*b*, the demodulated signal of the PLL 31*b* assumes a waveform, as indicated in FIG. 8(A). At this time, the output signal waveform of the synchronous detector 50*b* becomes as indicated in FIG. 8(B). When there is an input signal in which the higher harmonics of the direct-wave signal is admixed in the angle-modulated wave band, a disturbance wave is dissipated before the VCO 34*b* locks to the disturbance wave. The VCO 34*b* has a slow follow-up characteristic with respect to the high frequencies of the PLL 31*b*. The resulting demodulated output waveform is almost completely free of abnormal sounds as indicated in FIG. 8(C).

The output waveform of the synchronous detector 50*b* is as indicated in FIG. 8(D). The waveforms indicated in FIGS. 8(B) and 8(D) are theoretically determined waveforms. The actual output waveforms of the synchronous detector 50*b* respectively corresponding thereto are as indicated in FIGS. 8(E) and 8(F).

Figure 9:
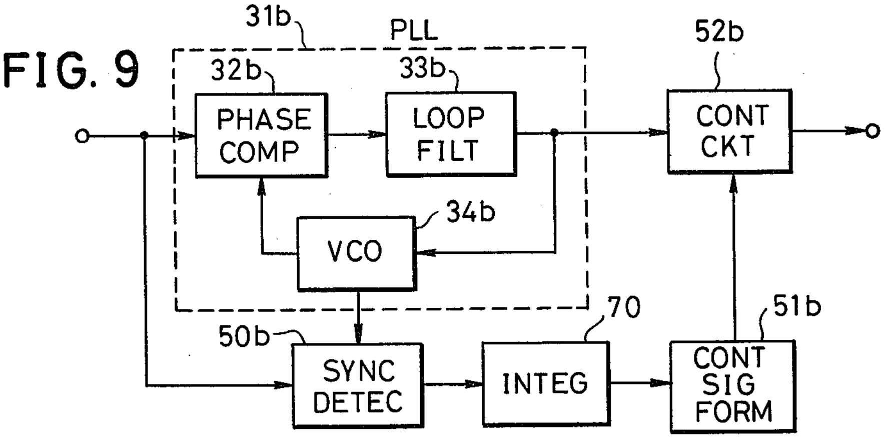
FIG. 9 is a block diagram of a modification of one of the system part illustrated in FIG. 5.

It is necessary to adapt the control signal forming circuit 51*b* to produce a control signal output, with respect to the output signal of the synchronous detector 50*b*, having the waveform indicated in FIG. 8(E). Circuit 51*b* should not produce a control signal output, with respect to the output signal, having the waveform indicated in FIG. 8(F). An example of a modification for positively and accurately carrying out this operation is shown in FIG. 9. FIG. 9 shows only the part of the system containing the PLL 51*b*, and the part containing the PLL 51*a* has been omitted.

As compared to FIG. 5, the embodiment in FIG. 9, has an integration circuit 70 inserted between the synchronous detector 50*b* and the control signal forming circuit 51*b*. The output signal of the synchronous detector 50*b* is supplied to this integration circuit 70 and is there integrated. The peak value of the signal obtained by the integration of the signal in FIG. 8(E) by the integration circuit 70 is greater than the peak value of the signal obtained by the integration of the signal in FIG. 8(F).

Accordingly, the threshold value of the control signal forming circuit 51*b* is set so that it detects the integrated peak value of the signal indicated in FIG. 8(E). However, it will not detect the integrated peak value of the signal indicated in FIG. 8(F). By this measure, detection of abnormalities can be positively and accurately accomplished.

In accordance with the present invention, at least two PLLs of mutually different lock ranges are used. Three or more PLLs could, of course, be used within the purview of the invention.

Further, this invention is not limited to these embodiments but various modifications may be made without departing from the scope and spirit of the invention.

What is claimed is:

1. A multichannel record disc reproducing system comprising:

a first phase-locked loop including a phase comparator and a voltage controlled oscillator for demodulating an angle-modulated signal separated from a signal picked up from a multichannel record disc on which a direct wave signal and an angle-modulated signal are recorded in a multiplexed state, said first phase-locked loop having a lock range of a first width;

a second phase-locked loop including a phase comparator and a voltage-controlled oscillator for demodulating said angle-modulated signal separated from the picked up signal, said second phase-locked loop having a lock range of a second width which is less than the width of said first lock range; and addition means for adding the demodulated output signal of said first phase-locked loop and the demodulated output signal of said second phase-locked loop.

2. A multichannel record disc reproducing system as claimed in claim 1 and means for setting said first lock range width at a large magnitude to demodulate without generating abnormal sound with respect to a modulation of a carrier responsive to signals of medium and low frequency range; and means for setting said second lock range width at a small magnitude which is less than the width of frequency deviation of an angle-modulated signal obtained by the modulation of a carrier with a modulation signal of said medium and low frequency range, whereby there is no erroneous locking to harmonic components of said direct-wave signal even when higher harmonic components are admixed in the frequency band of said angle-modulated signal.

3. A multichannel record disc reproducing system as claimed in claim 1 further comprising delay means between said first phase-locked loop and said adding means for delaying the demodulated output signal of said first phase-locked loop to effect a time coincidence thereof with the demodulated output signal of said second phase-locked loop, and correction means between said second phase-locked loop and said addition means for correcting the high-frequency characteristics of the demodulated output signal of said second phase-locked loop.

4. A multichannel record disc reproducing system as claimed in claim 1 further comprising:

a first synchronous detector means for producing an output voltage signal in accordance with the phase deviation from a specific phase difference of said separated angle-modulated signal with respect to the output signal of the voltage-controlled oscillator of said first phase-locked loop;

a second synchronous detector means for producing an output voltage signal in accordance with the phase deviation from a specific phase difference of said separated angle-modulated signal with respect to the output signal of the voltage-controlled oscillator of said first phase-locked loop;

a second synchronous detector means for producing an output voltage signal in accordance with the phase deviation from a specific phase difference of said separated angle-modulated signal with respect to the output signal of the voltage-controlled oscillator of said second phase-locked loop;

first control signal forming means for forming a first control signal responsive to the output voltage of said first synchronous detector means;

second control signal forming means for forming a second control signal responsive to the output voltage of said second synchronous detector means;

first control means between said first phase-locked loop and said addition means for attenuating or cutting off the demodulated output signal of said first phase-locked loop responsive to said first control signal; and second control means between said second phase-locked loop and said addition means for attenuating or cutting off the demodulated output signal of said second phase-locked loop responsive to said second control signal.

5. A multichannel record disc reproducing system as claimed in claim 4 in which said first control means comprises a first means for switching between conductive and nonconductive states responsive to said first control signal, and said second control means comprises a second means for switching between conductive and nonconductive states responsive to said second control signal, the output impedances of the preceding stages respectively of said first and second switching means being low values, the input impedances of the succeeding stages respectively of said first and second switching means being high values.

6. A multichannel record disc reproducing system as claimed in claim 4 further comprising an integration circuit means for integrating the output signal of said second synchronous detector means.

7. A multichannel record disc reproducing system as claimed in claim 1 in which: said angle-modulated wave is a signal obtained by angle modulating a 30 KHz carrier wave with a modulation signal; said first lock range width of said first phase-locked loop being approximately 15 KHz to 45 KHz; and said second lock range width of said second phase-locked loop being approximately 23 KHz to 37 KHz.

* * * * *